(12) United States Patent
Leung et al.

(10) Patent No.: US 9,793,199 B2
(45) Date of Patent: Oct. 17, 2017

(54) CIRCUIT BOARD WITH VIA TRACE CONNECTION AND METHOD OF MAKING THE SAME

(75) Inventors: Andrew K W Leung, Markham (CA); Neil McLellan, Toronto (CA); Yip Seng Low, Thornhill (CA)

(73) Assignee: ATI Technologies ULC, Markham (CA)

( * ) Notice: Subject to any disclaimer, the term of this patent is extended or adjusted under 35 U.S.C. 154(b) by 535 days.

(21) Appl. No.: 12/641,545

(22) Filed: Dec. 18, 2009

(65) Prior Publication Data

US 2011/0147061 A1    Jun. 23, 2011

(51) Int. Cl.
| | |
|---|---|
| H05K 1/11 | (2006.01) |
| H05K 3/20 | (2006.01) |
| H05K 3/10 | (2006.01) |
| H05K 7/10 | (2006.01) |
| H01L 23/498 | (2006.01) |
| H01L 21/48 | (2006.01) |

(52) U.S. Cl.
CPC ...... *H01L 23/49822* (2013.01); *H01L 21/486* (2013.01); *H01L 2224/16225* (2013.01); *H01L 2224/32225* (2013.01); *H01L 2224/73204* (2013.01); *H01L 2924/01322* (2013.01); *H01L 2924/15311* (2013.01); *Y10T 29/4913* (2015.01); *Y10T 29/49155* (2015.01)

(58) Field of Classification Search
CPC ............. H05K 3/429; H05K 2201/096; H05K 3/4602; H01L 23/49827
USPC ......... 174/262–266, 260; 361/792–795, 760, 361/773, 774, 767; 29/831, 832, 846
See application file for complete search history.

(56) References Cited

U.S. PATENT DOCUMENTS

| | | | |
|---|---|---|---|
| 5,199,163 A | | 4/1993 | Ehrenberg et al. |
| 5,436,412 A | * | 7/1995 | Ahmad et al. ............... 174/265 |
| 5,470,790 A | * | 11/1995 | Myers et al. ................ 438/625 |
| 5,510,580 A | * | 4/1996 | Shirai et al. ................. 174/266 |
| 5,877,559 A | * | 3/1999 | Takayama et al. ........... 257/773 |
| 6,280,640 B1 | | 8/2001 | Hurwitz et al. |
| 6,531,661 B2 | * | 3/2003 | Uchikawa et al. ........... 174/255 |
| 6,846,549 B2 | * | 1/2005 | Tani et al. .................... 428/209 |
| 7,084,354 B2 | * | 8/2006 | Boggs et al. ................. 174/262 |
| 7,287,323 B1 | | 10/2007 | Ehlert et al. |
| 2002/0086517 A1 | * | 7/2002 | Barth et al. .................. 438/618 |
| 2002/0108776 A1 | * | 8/2002 | Uchikawa et al. ........... 174/255 |
| 2003/0006066 A1 | * | 1/2003 | Appelt et al. ................ 174/261 |
| 2003/0231474 A1 | | 12/2003 | Boggs et al. |
| 2004/0065960 A1 | * | 4/2004 | Egitto et al. ................. 257/774 |
| 2004/0157442 A1 | * | 8/2004 | Cowley et al. .............. 438/687 |
| 2005/0025944 A1 | * | 2/2005 | Ogawa et al. ............... 428/209 |
| 2006/0231290 A1 | * | 10/2006 | Kariya et al. ................ 174/258 |

(Continued)

OTHER PUBLICATIONS

PCT/US2010/059982 International Search Report mailed Apr. 15, 2011.

(Continued)

*Primary Examiner* — Sherman Ng
(74) *Attorney, Agent, or Firm* — Timothy H. Honeycutt

(57) ABSTRACT

Various circuit boards and methods of manufacturing the same are disclosed. In one aspect, a method of manufacturing is provided that includes forming a first interconnect layer of a circuit board. The first interconnect layer includes a first conductor trace with a first segment that does not include a via land. A first via is formed on the first segment.

16 Claims, 6 Drawing Sheets

(56) References Cited

U.S. PATENT DOCUMENTS

| | | | |
|---|---|---|---|
| 2007/0130761 A1* | 6/2007 | Kang et al. | 29/830 |
| 2008/0093117 A1* | 4/2008 | Oikawa et al. | 174/262 |
| 2008/0101045 A1* | 5/2008 | Jung et al. | 361/761 |
| 2008/0115355 A1* | 5/2008 | Park et al. | 29/852 |
| 2008/0225501 A1 | 9/2008 | Cho et al. | |
| 2009/0255722 A1* | 10/2009 | Lee et al. | 174/264 |
| 2009/0294164 A1* | 12/2009 | Kim et al. | 174/262 |
| 2010/0212947 A1* | 8/2010 | Yamanaka et al. | 174/260 |

OTHER PUBLICATIONS

USPTO Office Action notification date May 14, 2013; U.S. Appl. No. 13/356,421.

\* cited by examiner

CIRCUIT BOARD WITH VIA TRACE CONNECTION AND METHOD OF MAKING THE SAME

BACKGROUND OF THE INVENTION

1. Field of the Invention

This invention relates generally to semiconductor processing, and more particularly to circuit boards with vias and to methods of making the same.

2. Description of the Related Art

Circuit boards of various types, including semiconductor chip package substrates and circuit cards, utilize conductor lines or traces to convey signals, power and ground from one point to another. Many conventional circuit board designs use multiple interconnect layers or levels. One layer is electrically linked to the next by way of conducting vias. The vias themselves are frequently formed on so-called via lands, which are shaped pads of conducting material. Many conventional circuit board vias typically have a circular footprint. One type of conventional via pad has a circular footprint and another type uses a rectangular footprint.

There is an on-going trend to squeeze more routing into circuit boards, particularly semiconductor chip package substrates. The need for greater routing complexity is caused by, among other things, increases in the number of input/outputs of ever more complex semiconductor die designs. It is not a trivial matter to insert more traces and vias into a circuit board layout. Indeed, the goal of increased routing must compete with design rules, which are put in place to ensure that manufacturing processes used to form the circuit board can do so reliably.

Conventional via and via lands are often vertically aligned from one interconnect layer to the next. Thus, one conventional mode for increasing packing density of routing traces involves shrinking both vias and lands. However, any attempt to shrink a via size to accommodate additional trace routing needs to account for attendant increase in current densities in the via. If current densities exceed threshold levels, device failure can occur. Many conventional designs try to avoid the issue by essentially over designing the via hole laser drilling process. Holes are laser drilled with generous sizes. However, the large via hole sizes tend to prevent the placement of traces adjacent the vias in order to satisfy design rules.

The present invention is directed to overcoming or reducing the effects of one or more of the foregoing disadvantages.

SUMMARY OF EMBODIMENTS OF THE INVENTION

In accordance with one aspect of an embodiment of the present invention, a method of manufacturing is provided that includes forming a first interconnect layer of a circuit board. The first interconnect layer includes a first conductor trace with a first segment that does not include a via land. A first via is formed on the first segment.

In accordance with another aspect of an embodiment of the present invention, a method of conveying current in a circuit board is provided that includes positioning a first via on a first segment of a first conductor trace in a first interconnect layer of the circuit board wherein the first segment does not include a via land. A first current is conveyed through the first conductor trace and the first via.

In accordance with another aspect of an embodiment of the present invention, a circuit board is provided that includes a first interconnect layer that has a first conductor trace with a first segment that does not include a via land. A first via is positioned on the first segment.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a printed circuit board, such as a semiconductor chip package carrier substrate, are described herein. One example includes multiple interconnect layers with at least one via positioned on a segment of a conductor trace where the segment does not include a via land. An adjacent via may also be positioned on another segment of another conductor trace where the additional segment also does not include a via land. Additional traces may be nested between the segments. By using via-to-trace connections without via lands, multiple traces can be nested between adjacent traces and trace packing density increased without increasing package substrate size. Additional details will now be described.

Figure 1:
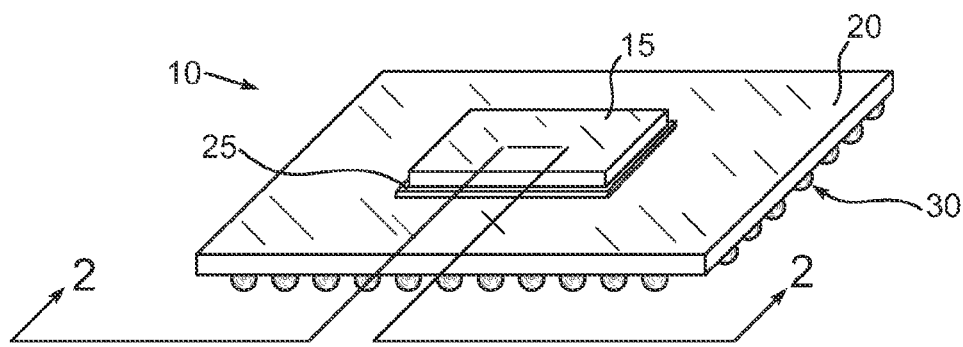
FIG. 1 is a pictorial view of an exemplary conventional semiconductor chip device that includes a semiconductor chip mounted on a circuit board.

In the drawings described below, reference numerals are generally repeated where identical elements appear in more than one figure. Turning now to the drawings, and in particular to FIG. 1, therein is shown a pictorial view of an exemplary conventional semiconductor chip package 10 that includes a semiconductor chip 15 mounted on a package substrate 20. An underfill material layer 25 is positioned between the semiconductor chip 15 and the package substrate 20. The package substrate 20 is provided with a number of conductor traces and vias and other structures in order to provide power, ground and signals transfers between the semiconductor chip 15 and some other circuit device that is not shown. To facilitate those transfers, the package substrate 20 includes input/outputs in the form of a ball grid array 30 consisting of plural solder balls.

Figure 2:
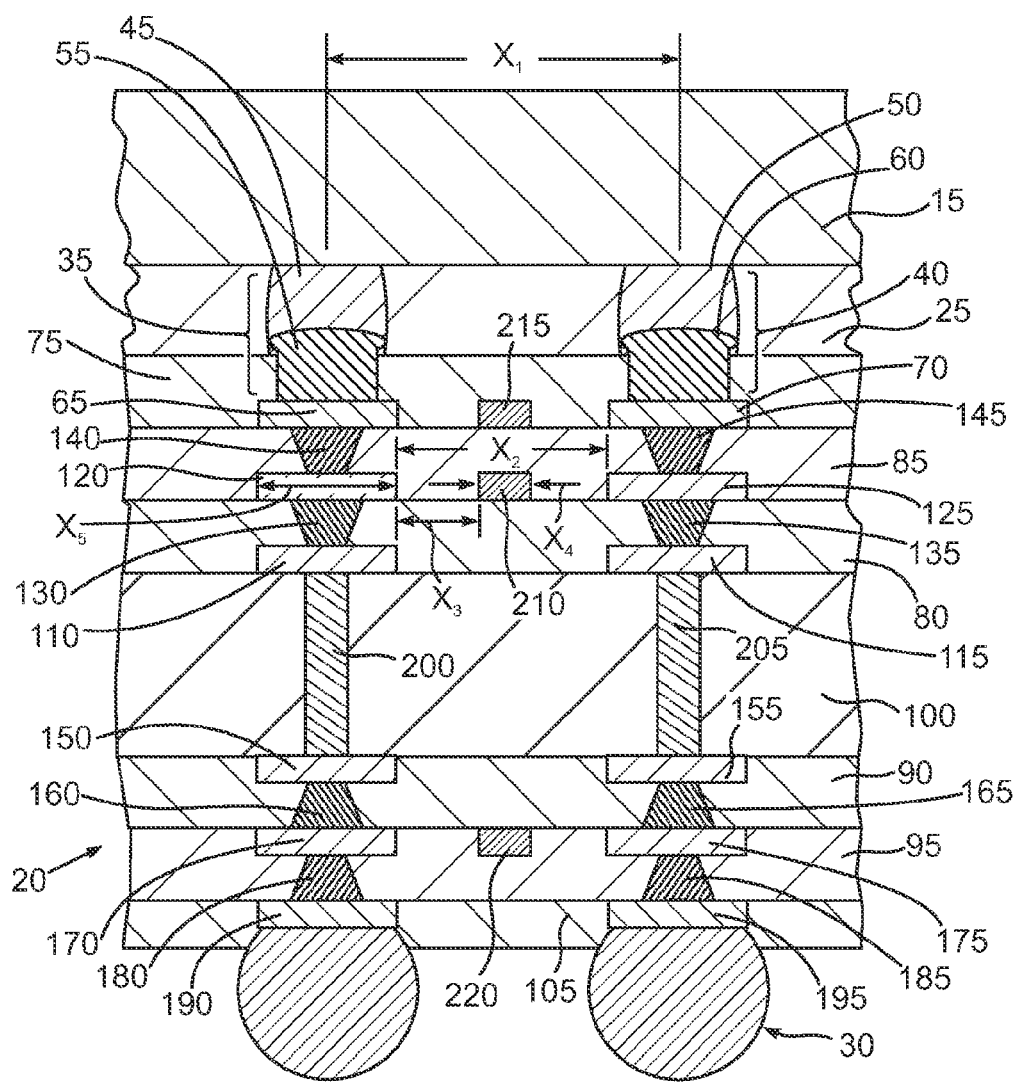
FIG. 2 is a sectional view of FIG. 1 taken at section 2-2.

Attention is now turned to FIG. 2, which is a sectional view of FIG. 1 taken at section 2-2. Note that section 2-2 only encompasses a rather small portion of the semiconductor chip 15 and the package substrate 20. As shown, the semiconductor chip 15 is flip-chip mounted to the circuit board 20 and electrically connected thereto by way of plural solder joints 35 and 40. While only two solder joints 35 and 40 are depicted, there may be scores, hundreds or even thousands of such joints depending upon the size of complexity of the semiconductor chip 15 and the package substrate 20. The solder joints 35 and 40 consist of respective solder bumps 45 and 50 that are coupled to the semiconductor chip 15 and presolders 55 and 60 that are metallurgically bonded to respective conductor pads 65 and 70 of the package substrate 20. The presolders 55 and 60 are separated laterally by a solder mask 75. The solder bumps 45 and 50 are metallurgically coupled to the presolders 55 and 60 by way of a reflow and bump collapse process.

The package substrate 20 is a 2-2-2 build-up design. In this regard, interconnect or build-up layers 80 and 85 and 90 and 95 are formed on opposite sides of a core 100. The build-up layers 80, 85, 90 and 95, the core 100, the solder mask 75 and another solder mask 105 formed on the build-up layer 95 make up an interconnect system for the package substrate 20. The following discussion of the various conductor structures in FIG. 2 will be illustrative of other conductor structures in the conventional package substrate 20. The build-up layer 80 includes respective via lands or pads 110 and 115 that are interconnected with another set of via lands 120 and 125 in the build-up layer 85 by way of respective vias 130 and 135 formed in the build-up layer 80. Similarly, the via lands 120 and 125 in the build-up layer 85 are electrically connected to the overlying conductor pads 65 and 70 in the solder mask 75 by way of respective vias 140 and 145. Electrical pathways through the build-up layers 90 and 95 and the solder mask 105 are similarly provided by way of via lands 150 and 155 and vias 160 and 165 in the build-up layer 90, via lands 170 and 175 and corresponding vias 180 and 185 in the build-up layer 95 and ball pads 190 and 195 in the solder mask 105 that are connected to the vias 180 and 185. The solder balls 30 are metallurgically bonded to the ball pads 190 and 195. Electrical pathways through the core 100 are provided by way of plated thru holes 200 and 205.

The solder joints 35 and 40 are fabricated with a bump pitch $x_1$, the size of which is dependent upon a variety of factors, such as the size of the semiconductor chip 15, the number of input/output pathways required for the semiconductor chip 15 and other considerations. The interconnect structures that are connected to the solder joint 35, such as the conductor pad 65, the via 140, the conductor land 120, the via 130 and the conductor land 110 are all vertically aligned with the solder joint 35 and have a circular footprint when viewed from above or below. The same is true for the various interconnect structures that are connected to the solder joint 40, such as the conductor pad 70, the via 145, the via land 125, the via 135 and the via land 115.

The build up layer 85 includes a conductor trace 210 that is positioned between the via lands 120 and 125 and the build up layer 75 includes a conductor trace 215 that is positioned between conductor pads 65 and 70. The conductor traces 210 and 215 provide routing of power, ground or signals. A typical conventional design rule for the conductor pads and vias is such that there is a minimum spacing $x_2$ between the via lands 120 and 125 in the build up layer 85. This minimum spacing $x_2$ is some combination of the gap $x_3$ between the conductor trace 210 and the via land 120, the corresponding gap between the conductor trace 210 and the conductor pad 125, and the width $x_4$ of the conductor trace 210. In accordance with this conventional design, and due to the bump pitch $x_1$ and the required minimum spacing $x_2$, only a single conductor trace 210 may be positioned in between the via lands 120 and 125 in the build up layer 85. The conventional via lands 120 and 125 are made relatively wide to accommodate the conventional vias 140 and 145. This width $x_5$ imposes a limit on routing between the lands 120 and 125.

Figure 3:
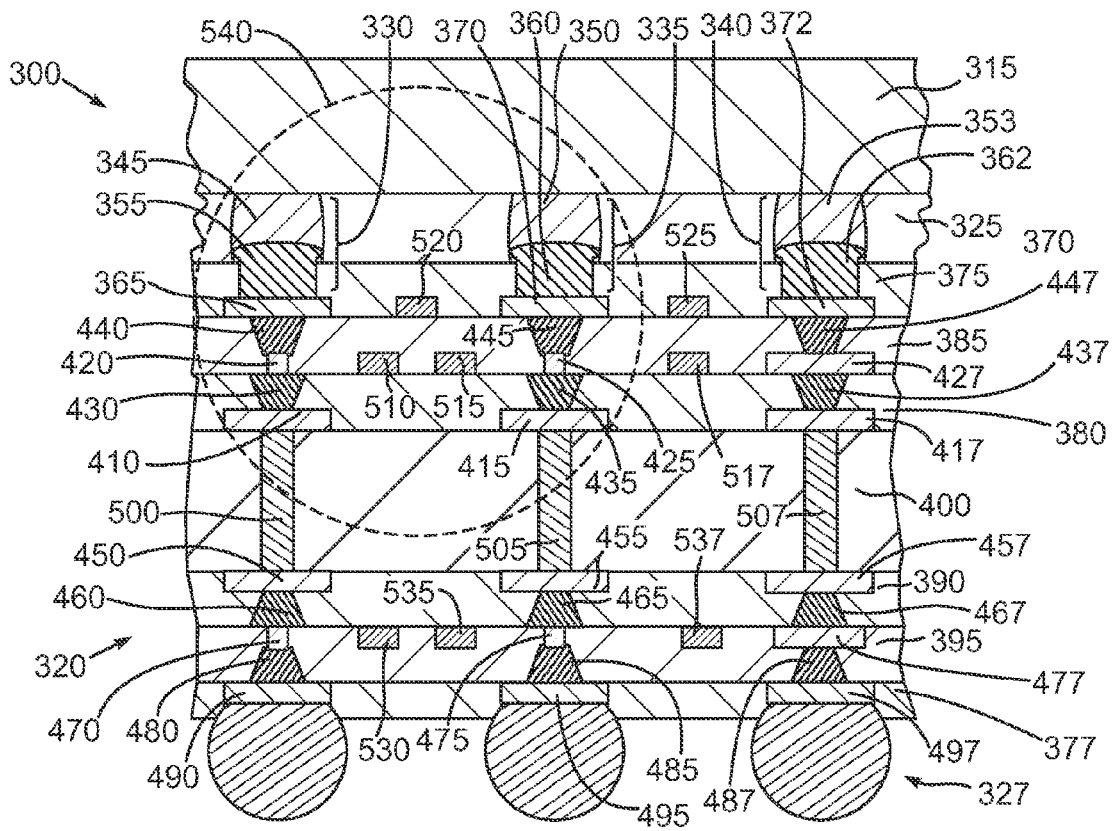
FIG. 3 is a sectional view of a small portion of an exemplary embodiment of a semiconductor chip device that includes a semiconductor chip mounted to a circuit board.

FIG. 3 is a sectional view of a small portion of an exemplary embodiment of a semiconductor chip device 300 that includes a semiconductor chip 315 mounted to a circuit board 320. An underfill material layer 325 is disposed between the semiconductor chip 315 and the circuit board 320 to lessen the effects of differential CTE. The semiconductor chip 315 may be any of a myriad of different types of circuit devices used in electronics, such as, for example, microprocessors, graphics processors, combined microprocessor/graphics processors, application specific integrated circuits, memory devices or the like, and may be single or multi-core or even stacked with additional dice. The semiconductor chip 315 may be constructed of bulk semiconductor, such as silicon or germanium, or semiconductor on insulator materials, such as silicon-on-insulator materials. The semiconductor chip 315 may be flip-chip mounted to the circuit board 320 and electrically connected thereto by solder joints or other structures. Interconnect schemes other than flip-chip solder joints may be used.

The circuit board 320 may be a semiconductor chip package substrate, a circuit card, or virtually any other type of printed circuit board. Although a monolithic structure could be used for the circuit board 320, a more typical configuration will utilize a build-up design. In this regard, the circuit board 320 may consist of a central core upon which one or more build-up layers are formed and below which an additional one or more build-up layers are formed. The core itself may consist of a stack of one or more layers. One example of such an arrangement may be a 2-2-2 arrangement where a single-layer core is laminated between two sets of two build-up layers. If implemented as a semiconductor chip package substrate, the number of layers in the circuit board 320 can vary from four to sixteen or more, although less than four may be used. So-called "coreless" designs may be used as well. The layers of the circuit board 320 may consist of an insulating material, such as various well-known epoxies or other polymers, interspersed with metal interconnects. A multi-layer configuration other than build-up could be used. Optionally, the circuit board 320 may be composed of well-known ceramics or other materials suitable for package substrates or other printed circuit boards.

The circuit board 320 is provided with a number of conductor traces and vias and other structures in order to provide power, ground and signals transfers between the semiconductor chip 315 and another circuit device that is not shown. To facilitate those transfers, the circuit board 320 may be provided with input/outputs in the form of a pin grid array, a ball grid array, a land grid array or other type of interconnect scheme. In this illustrative embodiment, the circuit board 320 is provided with a ball grid array consisting of plural solder balls 327.

The semiconductor chip 315 may be flip-chip mounted to the circuit board 320 and electrically interconnected thereto by solder joints, conductive pillars or other structures. In this illustrative embodiment, three solder structures or joints 330, 335 and 340 are depicted. While only three solder joints 330, 335 and 340 are depicted, there may be scores, hundreds or even thousands of such joints depending upon the size of complexity of the semiconductor chip 315 and the circuit board 320. The solder joints 330, 335 and 340 may consist of respective solder bumps 345, 350 and 353 that are coupled to the semiconductor chip 315 and presolders 355, 360 and 362 that are metallurgically bonded to respective conductor structures or pads 365, 370 and 372 of the circuit board 320. The solder bumps 345, 350 and 353 are metallurgically coupled to the presolders 355, 360 and 362 by way of a reflow and bump collapse process.

The solder bumps 345, 350 and 353, and the solder balls 327 may be composed of various lead-based or lead-free solders. An exemplary lead-based solder may have a composition at or near eutectic proportions, such as about 63% Sn and 37% Pb. Lead-free examples include tin-silver (about 97.3% Sn 2.7% Ag), tin-copper (about 99% Sn 1% Cu), tin-silver-copper (about 96.5% Sn 3% Ag 0.5% Cu) or the like. The presolders 355, 360 and 362 may be composed of the same types of materials. Optionally, the presolders 355, 360 and 362 may be eliminated in favor of a single solder structure or a solder plus a conducting pillar arrangement. The underfill material layer 325 may be, for example, an epoxy resin mixed with silica fillers and phenol resins, and deposited before or after the re-flow process to establish the solder joints 330, 335 and 340. The presolders 355, 360 and 362 and the conductor pads 365, 370 and 372 are surrounded laterally by a solder mask 375 that is patterned lithographically, by laser ablation or the like, to form plural openings in order to accommodate the various presolders, for example, the presolders 355, 360 and 362. Another solder mask 377 is positioned on the opposite side of the circuit board 320 to facilitate the attachment of the solder balls 327. The solder masks 375 and 377 may be fabricated from a variety of materials suitable for solder mask fabrication, such as, for example, PSR-4000 AUS703 manufactured by Taiyo Ink Mfg. Co., Ltd. or SR7000 manufactured by Hitachi Chemical Co., Ltd.

In this illustrative embodiment, the circuit board 320 is implemented as a semiconductor chip package with a 2-2-2 build-up design. In this regard, interconnect or build-up layers 380 and 385 and 390 and 395 are formed on opposite sides of a core 400. The core 400 may be monolithic or a laminate or two or more layers as desired. The core 400 and the build-up layers 380, 385, 390 and 395 may be composed of well-known polymeric materials, such as, GX13 supplied by Ajinomoto, Ltd. The build-up layers 380, 385, 390 and 395, the core 400, and the solder masks 375 and 377 make up an interconnect system for the circuit board 320. The following discussion of the various conductor structures in FIG. 3 will be illustrative of other conductor structures in the circuit board 320. The build-up layer 380 may include respective conductor structures or via lands 410, 415 and 417. The via lands 410 and 415 are interconnected or in ohmic contact with another set of conductor structures or traces 420 and 425 in the build-up layer 385 by way of respective vias 430 and 435 formed in the build-up layer 380. The conductor pad 417 may be electrically connected to another conductor structure or via land 427 formed in the buildup layer 385 by a via 437 formed in the buildup layer 380. Similarly, the conductor traces 420, 425 and the land 427 in the build-up layer 385 may be electrically connected to the overlying conductor pads 365, 370 and 372 in the solder mask 375 by way of respective vias 440, 445 and 447. Electrical pathways through the build-up layers 390 and 395 and the solder mask 377 may be similarly provided by way of conductor structures or via lands 450, 455 and 457 and vias 460, 465 and 467 in the build-up layer 390, conductor traces 470 and 475, a conductor structure or via land 477 and corresponding vias 480, 485 and 487 in the build-up layer 395 and ball pads 490, 495 and 497 in the solder mask 377 that are connected to the vias 480, 485 and 487. The solder balls 327 are metallurgically bonded to the ball pads 490, 495 and 497. Electrical pathways through the core 400 may be provided by way of thru-vias 500, 505 and 507, which may be plated thru holes or other types of conductors.

Still referring to FIG. 3, the buildup layer 385 may include plural conductor traces, three of which are visible and labeled 510, 515 and 517, respectively. The buildup layer 375 may include plural conductor traces 520 and 525 and the buildup layer 395 may include conductor traces 530, 535 and 537. The conductor traces 510 and 515 may be nested between the conductor traces 420 and 425 and the conductor traces 530 and 535 may be nested between the conductor traces 470 and 475. As described in more detail below, the advantageous nesting of multiple traces 510 and 515 between the conductor traces 420 and 425 and the traces 530 and 535 between the conductor traces 470 and 475 provides for more complex and flexible routing of power, ground and/or signals in the circuit board 320 than might otherwise be possible using conventional designs where design rules and conventional interconnect placement might prevent the nesting of such multiple traces.

Figure 4:
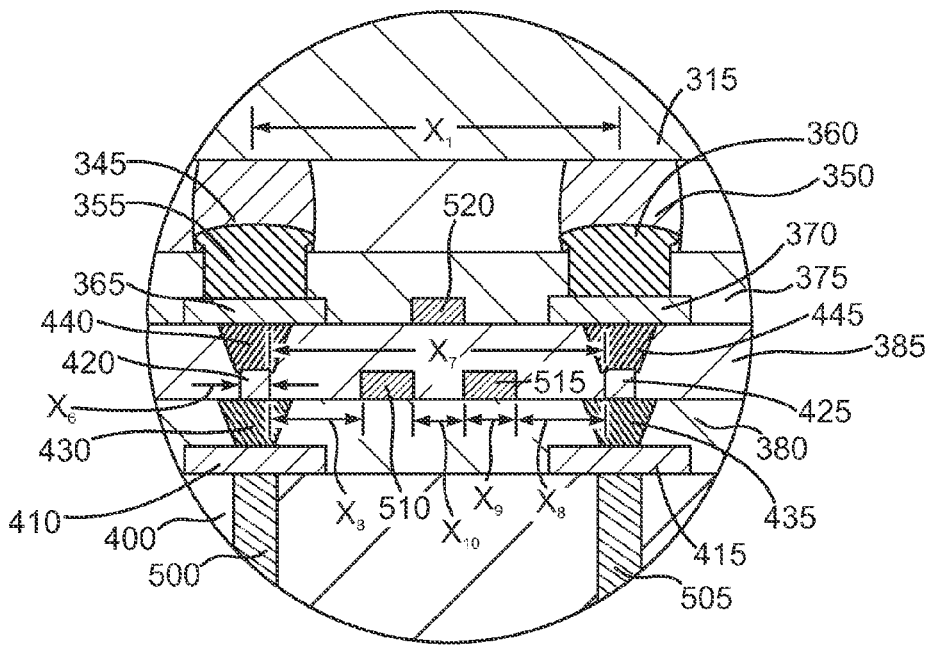
FIG. 4 is a portion of FIG. 3 shown at greater magnification.

The portion of FIG. 3 circumscribed by the dashed circle 540 will be shown at greater magnification in FIG. 4. Attention is now turned to FIG. 4. A technical goal of this illustrative embodiment is to enable the nesting of the two traces 510 and 515 between the conductor traces 420 and 425 and vias 440 and 445 without having to increase the bump pitch between the solder joints 330 and 335 beyond the value $x_1$. To accomplish this nesting, the conductor traces 420 and 425 are fabricated as traces and not as via lands and the corresponding vias 440 and 445 are formed on the traces 420 and 425. The conductor traces 420 and 425 may be fabricated with a width $x_6$ that is narrower than the vias 440 and 445 and narrower still than the width $x_5$ of the conventional via lands 120 and 125 depicted in FIG. 2. The vias 430 and 435 in the build up layer 380 may be substantially vertically aligned with their respective via lands 410 and 415 and the underlying plated through holes 500 and 505 in the core 400. Similarly, the solder bump 345, the presolder 355 and the conductor pad 365 may be vertically aligned and the solder bump 350, the presolder 360 and the conductor pad 370 may be vertically aligned. The narrow width $x_6$ of conductor traces 420 and 425 provides a gap with a width $x_7$. The total gap $x_7$ may be the sum of the gaps $x_8$ between the conductor trace 420 and the trace 510 and the trace 515 and the conductor trace 425, the combined lateral dimensions $x_9$ of the traces 510 and 515 and the gap $x_{10}$ between the traces 510 and 515. If desired, the quantities $x_8$, $x_9$ and $x_{10}$ may be equal or unequal. In this way, some minimum design rule spacing between a trace and a land such as the spacing $x_8$ and some minimum inter trace spacing, such as $x_{10}$, may be maintained while providing nested traces without expanding the bump pitch $x_1$. The conductor trace 520 may be positioned between the conductor pads 365 and 370 in the conventional manner. Optionally, multiple traces may be nested on multiple build up layers, such as not only build up layer 385 but also in the solder mask 375, if desired. Thus, more complex routing to facilitate greater complexity of input/outputs from the semiconductor chip 315 may be provided without expanding the bump pitch beyond $x_1$.

Figure 5:
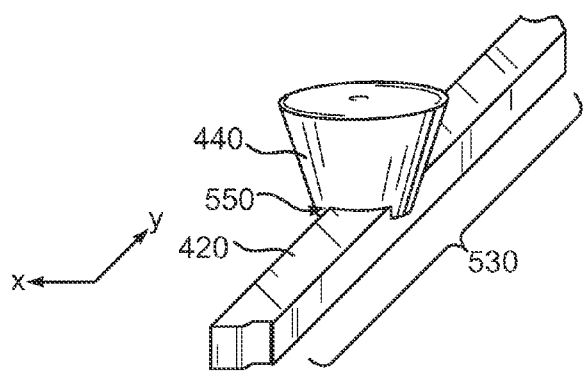
FIG. 5 is a pictorial view of an exemplary via positioned on a segment of an exemplary conductor trace.

Additional details of the arrangement of a via and an underlying conductor trace serving as both a trace and a via land may be understood by referring now to FIG. 5, which is a pictorial view of a portion of the conductor trace 420 and the via 440. Here, the conductor trace 420 includes at least one segment 530 that is not formed or otherwise provided with a via land. The segment 530 could be linear, curved or some other shape. The via 440 may include a notch 550 that cooperates with the underlying trace 420, and in particular the segment 530, in a tongue and groove fashion. This arrangement enables the physical connection between the via 440 and the trace 420 to resist shear stresses in, for example, the x-y plane. The notch 550 may be established for the via 440 at the time the via 440 is formed as described more fully below. The mounting of the via 440 on the segment 530 of the conductor trace 420 without a via land enables the tighter spacing and extra nested traces described herein. Of course, other portions of the conductor trace 420 may be provided with conventional via lands if desired.

Figure 6:
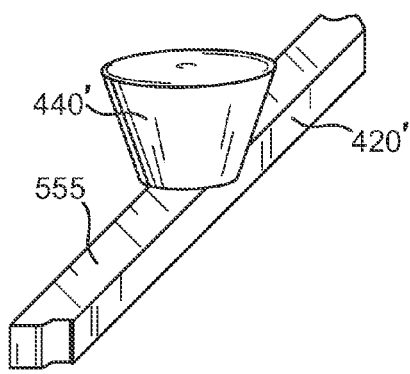
FIG. 6 is a pictorial view of an alternate exemplary via positioned on a segment of an alternate exemplary conductor trace.

It should be understood that a variety of arrangements may be used to establish physical contact between a via and an underlying trace serving as both trace and via land. FIG. 6 depicts a pictorial view of an alternate exemplary embodiment of a via 440' positioned on a conductor trace 420'. The conductor trace 420' may be configured substantially identically to the other conductor traces that serve as via lands disclosed herein. The via 440' may be in other respects identical to the other disclosed vias. However, in this illustrative embodiment, the via 440' is not provided with a notch but is instead seated directly on an upper surface 555 of the conductor trace 420'. Depending upon the compositions of the via 440' and the conductor trace 420', there will still be a metallurgical bond established between the via 440' and the trace 420'.

Figure 7:
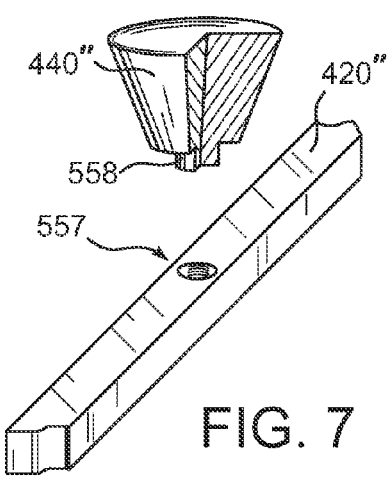
FIG. 7 is an exploded pictorial view of an alternate exemplary via positioned on a segment of an alternate exemplary conductor trace.

Another alternate exemplary embodiment is depicted pictorially and in half section in FIG. 7. Here, a conductor trace 420" may be provided with a circular opening 557 and a via 440" may be provided with a downwardly projecting circular boss 558 that is sized to fit in the opening 557. The engagement between the boss 558 and the opening 557 provides a shear stress resistant joint to avoid delamination of the via 440" and the conductor trace 420".

Figure 8:
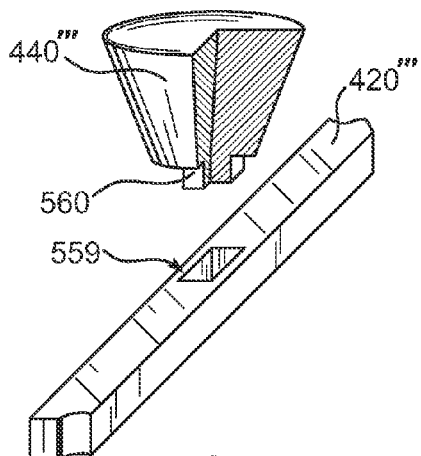
FIG. 8 is an exploded pictorial view of an alternate exemplary via positioned on a segment of an alternate exemplary conductor trace.

In yet another alternate exemplary embodiment depicted pictorially and in half section in FIG. 8, a conductor trace 420''' may be provided with a rectangular opening 559 and a via 440''' may be provided with a rectangular boss 560 that is designed to seat in the opening 559 to similarly provide a joint that is resistant to shear stresses. The skilled artisan will appreciate that the footprints of the openings and bosses for the conductor traces and vias of any of the embodiments disclosed herein may be subject to great variation.

Figure 9:
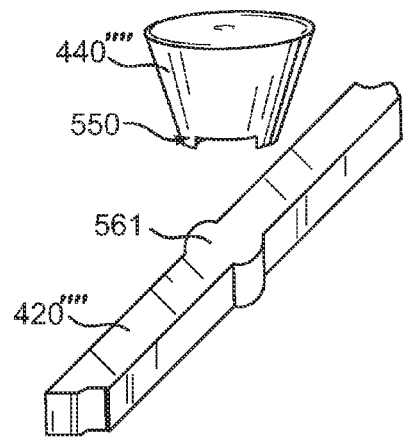
FIG. 9 is a an exploded pictorial view of an alternate exemplary via positioned on a segment of an alternate exemplary conductor trace.

In still another alternate exemplary embodiment depicted in exploded pictorial in FIG. 9, a conductor trace 420"" may be provided with a rounded cap 561 and a via 440"" may be provided with a rounded notch 550"" that is designed to seat over the rounded cap 561 to similarly provide a joint that is resistant to shear stresses. The rounded cap 561 is preferably smaller in footprint than the via 440"".

Figure 10:
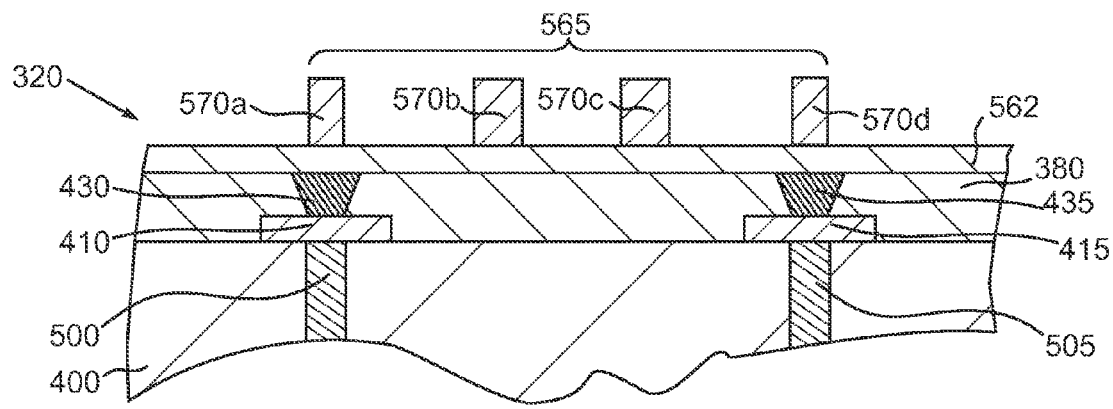
FIG. 10 is a sectional view of a portion of the circuit board shown in FIG. 3 depicting exemplary processing steps to establish conductor traces.

An exemplary method for fabricating the conductor traces 420 and 425 and vias 440 and 445 and other structures of the interconnect scheme may be understood by referring now to FIGS. 10, 11, 12 and 13 and initially to FIG. 10. FIG. 10 is a sectional view like FIG. 3, but for simplicity of illustration only depicts an upper portion of the core 400 and the thru-vias 500 and 505 of the circuit board 320. In addition, the overlying semiconductor chip 315 depicted in FIGS. 3 and 4 is not attached at this point and thus not depicted. The build-up layer 380 including the via lands 410 and 415 and the vias 430 and 435 have already been constructed. At this point, a conductor layer 562 may be applied to the build-up layer 380. Through subsequent processing, the conductor layer 562 will be transformed into pairs of conductor traces which include segments that do not include via lands but still serve as via lands, and via lands which may serve as routing traces as described in more detail below. The conductor layer 562 may be fabricated from a variety of conductor materials, such as aluminum, copper, silver, gold, titanium, refractory metals, refractory metal compounds, alloys of these or the like. In lieu of a unitary structure, the conductor layer 562 may consist of a laminate of plural metal layers, such as a titanium layer followed by a nickel-vanadium layer followed by a copper layer. In another embodiment, a titanium layer may be covered with a copper layer followed by a top coating of nickel. However, the skilled artisan will appreciate that a great variety of conducting materials may be used for the conductor layer 562. The exemplary materials may be used for any of the disclosed embodiments. Various well-known techniques for applying metallic materials may be used, such as physical vapor deposition, chemical vapor deposition, plating or the like. In an exemplary embodiment, the conductor layer 562 may be composed of copper and deposited by well-known plating processes.

At this stage, a mask 565 may be formed on the conductor layer 562 and patterned lithographically into plural portions 570*a*, 570*b*, 570*c* and 570*d*. The mask portions 570*a* and 570*d* are patterned to have the desired footprints of the later formed conductor traces (including the target widths $x_6$ in FIG. 3). The portions 570*b* and 570*c* are patterned to have the desired footprints of the later formed nested conductor structures. The mask may be composed of well-known resist materials and developed using well-known lithography processes.

Figure 11:
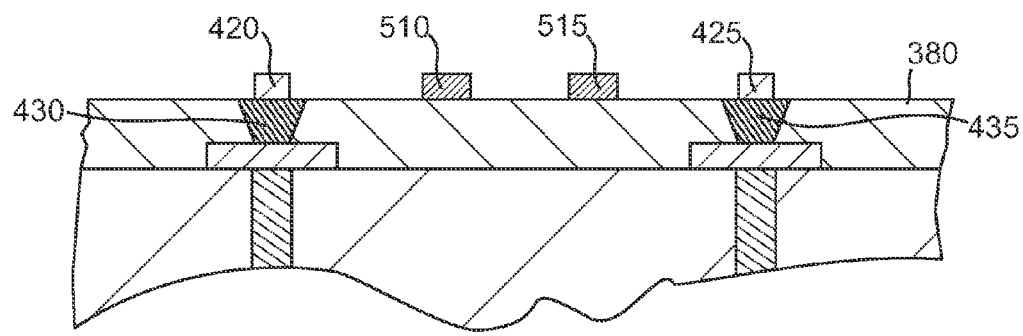
FIG. 11 is a sectional view like FIG. 9, but depicting additional exemplary processing steps to establish conductor traces.

Referring now also to FIG. 11, following the formation of the mask 565, the conductor layer 562 is subjected to an etch process to remove those exposed portions thereof and leave the conductor traces 420, 425, 510 and 515. A directional plasma etch may be used. Endpoint should be monitored to avoid excessive removal of the underlying vias 430 and 435. Following the etch process, the mask 565 may be removed by ashing, solvent stripping or combinations of the two. The mask strip should be tailored to avoid unacceptable damage to the buildup layer 380. Note that the portions of the traces 420 and 425 visible will include segments that do not include via lands, like the segment 530 depicted in FIG. 5.

Figure 12:
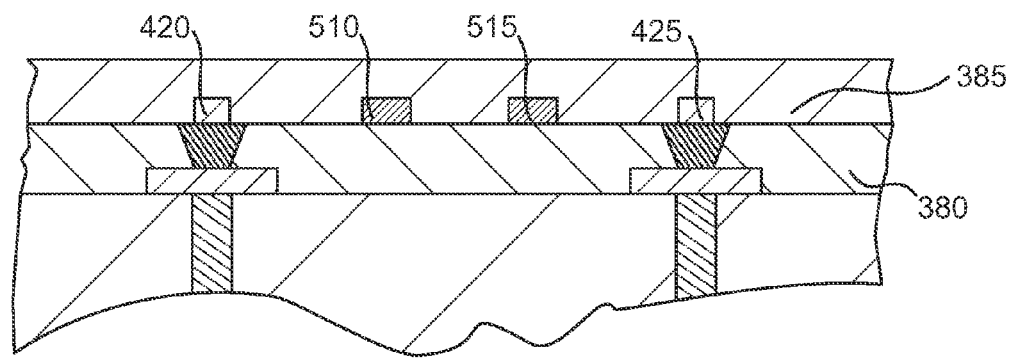
FIG. 12 is a sectional view like FIG. 10, but depicting formation of a build-up layer.

Attention is now turned to FIG. 12. Following the patterning of the conductor traces 420, 425, 510 and 515, the build-up layer 385 may be formed on the buildup layer 380. An insulating material of the type(s) described elsewhere herein may be deposited by spin coating or other techniques and cured by heating or otherwise. At this stage, the build-up layer 385 covers the traces 420, 425, 510 and 515.

An exemplary process of forming openings in the build-up layer 385 to accommodate the subsequently formed vias will be described now in conjunction with FIG. 13. In an exemplary embodiment, the openings 575 and 580 may be formed over the conductor traces 420 and 425 by laser cutting. A laser 585 may deliver the laser radiation 590 in pulses or as a continuous beam. The wavelength and spot size of the laser radiation 590 are selected to effectively ablate the build-up layer material layer 385 while producing the openings 575 and 580 with desired sizes and footprints. For example, radiation 590 in the ultraviolet range and with a spot size in the 2 to 5 micron range could be used. In this illustrative embodiment suitable for the via tongue-and-groove arrangement depicted in FIGS. 3, 4 and 5, it is necessary for the openings 575 and 580 to be drilled down to slightly below the tops of the conductor traces 420 and 425. Some care should be exercised to ensure that the cutting process does not remove excessive material from the conductor traces 420 and 425. The nested traces 510 and 515 remain buried in the buildup layer 385. It should be understood that for a via-to-trace arrangement of the type depicted in FIG. 6, the openings 575 and 580 will not be drilled below the tops of the conductor traces 420 and 425.

Figure 14:
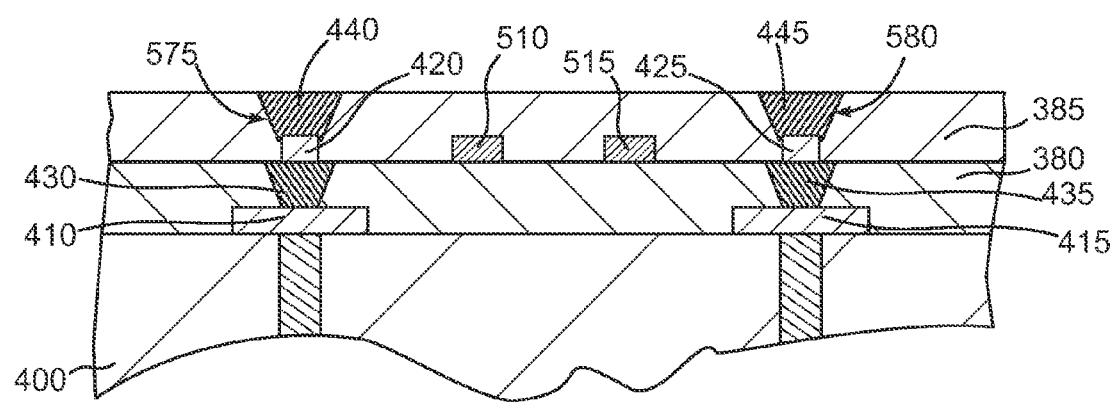
FIG. 14 is a sectional view like FIG. 12, but depicting exemplary via formation.

Referring now to FIG. 14, following the formation of the openings 575 and 580, the vias 440 and 445 may be formed therein. The vias 440 and 445 may be composed of a variety of conductor materials, such as aluminum, copper, silver, gold, titanium, refractory metals, refractory metal compounds, alloys of these or the like. In lieu of a unitary structure, the vias 440 and 445 may consist of a laminate of plural metal layers, such as a titanium layer followed by a nickel-vanadium layer followed by a copper layer. In another embodiment, a titanium layer may be covered with a copper layer followed by a top coating of nickel. However, the skilled artisan will appreciate that a great variety of conducting materials may be used for the vias 440 and 445. Various well-known techniques for applying metallic materials may be used, such as physical vapor deposition, chemical vapor deposition, plating or the like. In an exemplary embodiment, the vias may be formed by copper plating performed in two stages. The first stage involves the application of a relatively thin layer of copper in the openings 575 and 580. In a second stage a bulk plating process is performed to fill in the vias 440 and 445.

The processes described herein for establishing the build-up layer 385 on the buildup layer 380, including the conductor traces 420 and 425, the traces 510 and 515 and the vias 440 and 445, may also be used to establish the build-up layer 380 including the via lands 410 and 415 and the vias 430 and 435 thereof. The same is true for any of the other layers on the opposite side of the core 400.

Figure 13:
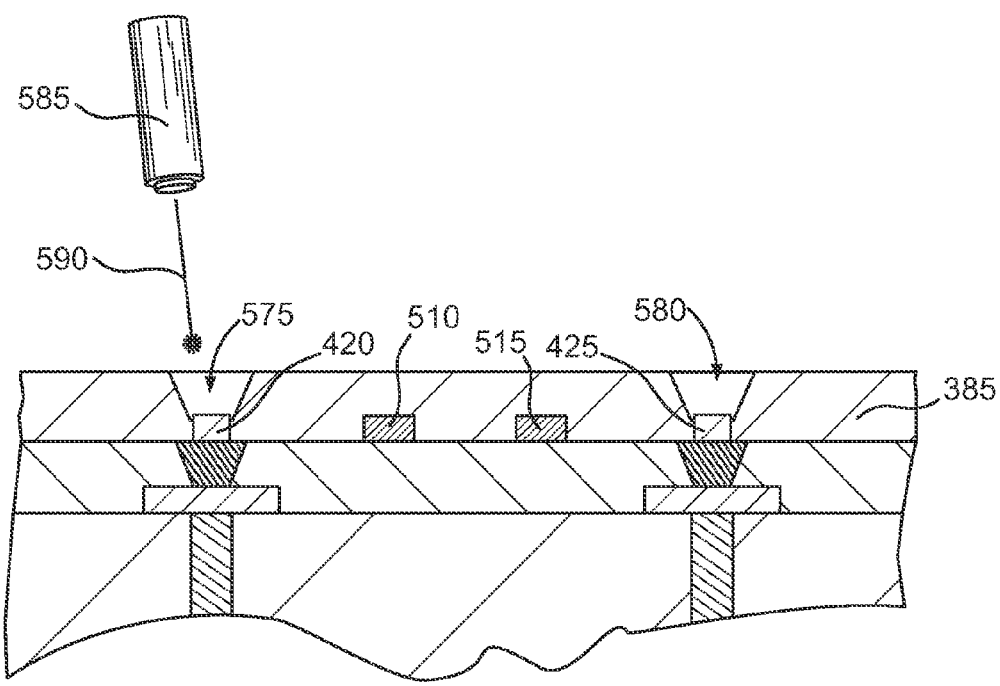
FIG. 13 is a sectional view like FIG. 11, but depicting laser drilling of via openings in the build-up layer.
Figure 15:
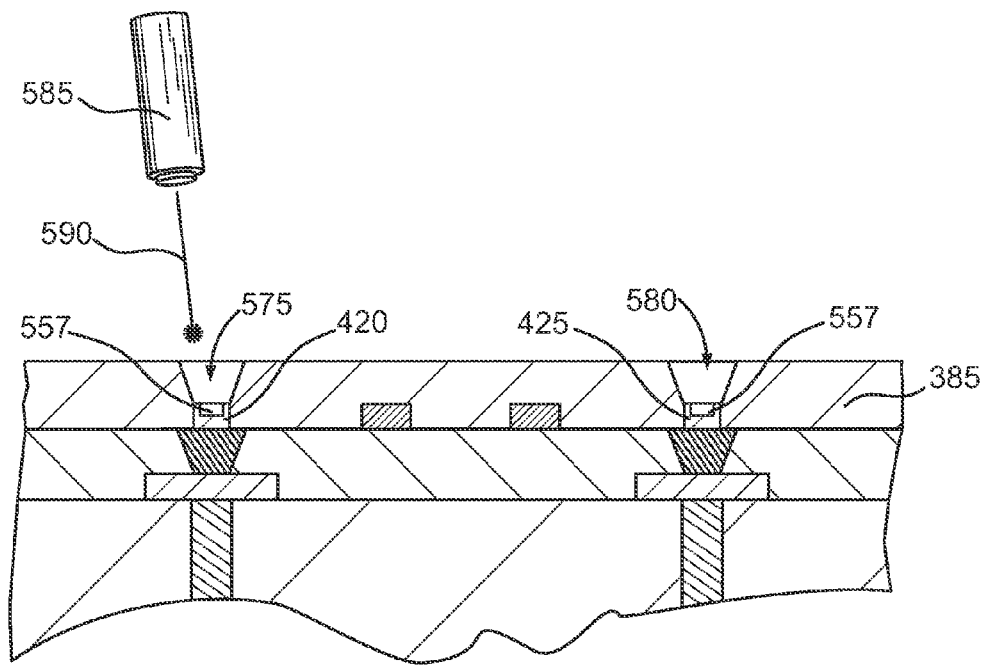
FIG. 15 is a sectional view like FIG. 11, but depicting alternate exemplary laser drilling of via openings and trace openings.

FIG. 15 depicts a sectional view like FIG. 13, but of an alternate exemplary process suitable for the via-to-trace arrangements depicted in FIG. 7 or 8. Here, the openings 575 and 580 may be cut as into the buildup layer 385 as described elsewhere herein. After the conductor traces 420 and 425 are initially exposed, the cutting beam 590 is focused on forming the openings 557 (or see 559 in FIG. 8 in the event of a rectangular opening) in the conductor traces 420 and 425. Again, laser ablation can provide focused material removal. Thereafter, the vias, such as the vias 440'' or 440''' may be formed using the techniques described above.

Figure 16:
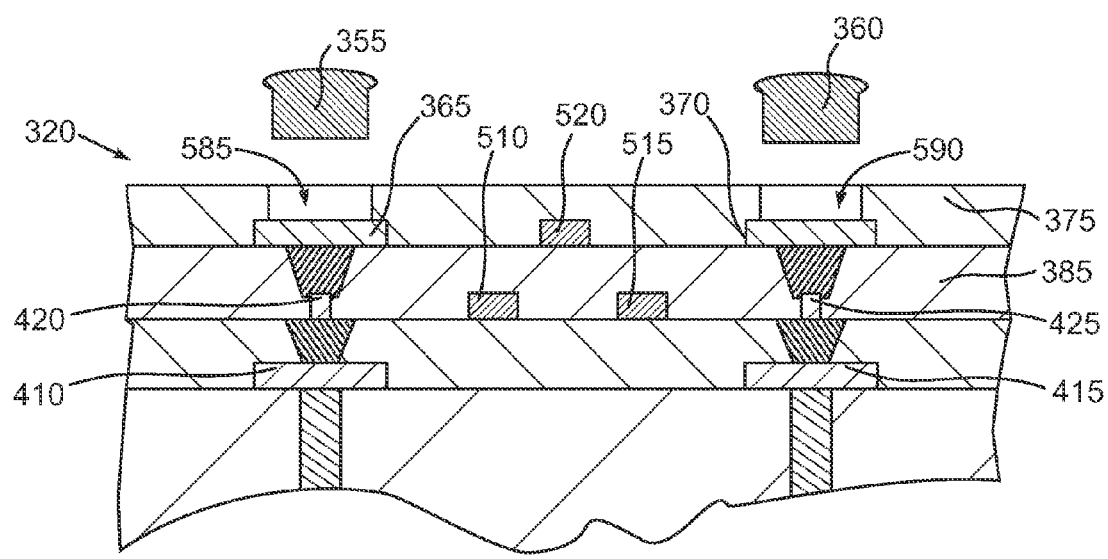
FIG. 16 is a sectional view like FIG. 13, but depicting presolder attachment.

Referring now to FIG. 16, the build-up layer consisting of the solder mask 375, the conductor pads 365 and 370 and the conductor trace 520 may be formed on the build-up layer 385 by well-known material deposition and patterning techniques. For example, the conductor pads 365 and 370 and the conductor trace 520 may be fabricated using the same general conductor deposition and patterning techniques used to form the via lands 410 and 415 and the conductor traces 420, 425, 510 and 515 as described elsewhere herein. The solder mask 375 may be deposited using well-known solder mask deposition techniques, such as spin coating or other deposition techniques as desired. Suitable openings 585 and 590 may be formed in the solder mask 375 by well-known lithographic patterning techniques. The openings 585 and 590 are advantageously positioned over the conductor pads 365 and 370. At this point, the presolders 355 and 360 may be positioned in the openings 585 and 590 and coined as shown. For example, a solder paste may be applied by stencil or the like. A reflow may be performed at this point to bond the presolders 355 and 360 to the underlying conductor pads 365 and 370. Following the application of the presolders 355 and 360, the semiconductor chip 315 depicted in FIGS. 1 and 2 may be positioned on the circuit board 320 and mounted to the presolders 355 and 360. A reflow process performed to create the solder joints 330 and 335 depicted in FIG. 2. The temperature and duration of the reflow will depend upon the types of solders and the geometry of the circuit board 320 and the semiconductor chip 315.

It should be understood that the processes described herein could be performed on a discrete circuit board or en masse on a strip or other aggregation of circuit boards. If done on en masse, the individual circuit boards may be singulated at some stage by sawing or other techniques.

Any of the exemplary embodiments disclosed herein may be embodied in instructions disposed in a computer readable medium, such as, for example, semiconductor, magnetic disk, optical disk or other storage medium or as a computer data signal. The instructions or software may be capable of synthesizing and/or simulating the circuit structures disclosed herein. In an exemplary embodiment, an electronic design automation program, such as Cadence APD, Encore or the like, may be used to synthesize the disclosed circuit structures. The resulting code may be used to fabricate the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
    forming a first interconnect layer of a circuit board by forming a first conductor trace with a first segment that does not include a via land, a second conductor trace with a second segment that does not include a via land, third and fourth conductor traces in spaced apart relation and in between the first and second segments and an insulating layer over the first, second, third and fourth conductor traces; and
    forming a first via on the first segment and a second via on the second segment but without forming a third via between the first and second vias wherein the first via is formed with a groove to engage the first segment.

2. The method of claim 1, wherein the forming the first and second vias comprises forming first and second openings in the interconnect layer to expose portions of the first and second segments and substantially filling the first and second openings with conductive material.

3. The method of claim 2, comprising forming the first and second vias so as not to protrude laterally substantially from the first and second openings.

4. The method of claim 1, comprising coupling a semiconductor chip to the circuit board.

5. The method of claim 1, comprising forming the first conductor trace and first via using instructions stored in a computer readable medium.

6. The method of claim 1, comprising forming a second interconnect layer on the first interconnect layer.

7. A method of conveying current in a circuit board, comprising:
- positioning a first via on a first segment of a first conductor trace in a first interconnect layer of the circuit board wherein the first segment does not include a via land and a second via on a second segment of a second conductor trace in the first interconnect layer wherein the second segment does not include a via land, the first and second vias bracketing a third conductor trace and a fourth conductor trace in spaced apart relation in the first interconnect layer, the first and second vias not bracketing another via, the first via being wider than the first segment and having a groove to engage the first segment and the second via being wider than the second segment; and
- conveying a first current through the first conductor trace and the first via.

8. The method of claim 7, wherein the first current comprises electrical signals.

9. The method of claim 7, comprising conveying a second current through the second via and the second conductor trace.

10. The method of claim 7, comprising conveying a third current through at least one of the third and fourth conductor traces.

11. The method of claim 10, wherein the circuit board comprises a semiconductor chip, the method comprising using the third and fourth conductor traces to convey the third current between the semiconductor chip and the circuit board.

12. A circuit board, comprising:
- a first interconnect layer including a first conductor trace with a first segment that does not include a via land and a second conductor trace with a second segment that does not include a via land;
- a first via on the first segment, a second via on the second segment but no via between the first and second segments, the first via being wider than the first segment and having a groove to engage the first segment and the second via being wider than the second segment; and
- a third conductor trace and a fourth conductor trace in the first interconnect layer in spaced apart relation and in between the first and second vias.

13. The circuit board of claim 12, wherein the first and second vias comprises respective openings in the first interconnect layer to respective portions of the first and second segments and a conductive material substantially filling the openings.

14. The circuit board of claim 13, wherein the first and second vias do not protrude laterally substantially from the openings.

15. The circuit board of claim 12, wherein the first interconnect layer comprises a build-up layer.

16. The circuit board of claim 12, comprising a semiconductor chip coupled to the circuit board.

* * * * *